(12) United States Patent
Chiba et al.

(10) Patent No.: US 11,047,627 B2
(45) Date of Patent: Jun. 29, 2021

(54) COOLING DEVICE (71) Applicant: NEC Corporation, Tokyo (JP)

(72) Inventors: Masaki Chiba, Tokyo (JP); Mahiro Hachiya, Tokyo (JP); Minoru Yoshikawa, Tokyo (JP)

(73) Assignee: NEC CORPORATION, Tokyo (JP)

( * ) Notice: Subject to any disclaimer, the term of this patent is extended or adjusted under 35 U.S.C. 154(b) by 357 days.

(21) Appl. No.: 16/088,197

(22) PCT Filed: Mar. 21, 2017

(86) PCT No.: PCT/JP2017/011159
§ 371 (c)(1),
(2) Date: Sep. 25, 2018

(87) PCT Pub. No.: WO2017/169969
PCT Pub. Date: Oct. 5, 2017

(65) Prior Publication Data
US 2020/0300554 A1    Sep. 24, 2020

(30) Foreign Application Priority Data

Mar. 31, 2016 (JP) .............................. JP2016-072859

(51) Int. Cl.
*F28D 15/02*      (2006.01)
*H05K 7/20*       (2006.01)
(Continued)

(52) U.S. Cl.
CPC ............ *F28D 15/0266* (2013.01); *F28F 1/40* (2013.01); *H01L 23/427* (2013.01);
(Continued)

(58) Field of Classification Search
CPC ............... H01L 23/3672; H01L 23/473; F28D 15/0275; F28D 15/0233; F28D 15/0266;
(Continued)

(56) References Cited

U.S. PATENT DOCUMENTS 4,494,171 A * 1/1985 Bland ..................... F28F 3/086
165/908
2006/0272798 A1* 12/2006 Liu ....................... H01L 23/427
165/104.33

(Continued)

FOREIGN PATENT DOCUMENTS

JP       2007-010211 A    1/2007
JP       2009-088125 A    4/2009
(Continued)

OTHER PUBLICATIONS

International Search Report of PCT/JP2017/011159 dated May 16, 2017 [PCT/ISA/210].

(Continued)

*Primary Examiner* — Adam B Dravininkas
(74) *Attorney, Agent, or Firm* — Sughrue Mion, PLLC (57) ABSTRACT

An evaporator includes: a first surface which conducts heat; a heat medium in the evaporator, which vaporizes as a result of the heat absorbed; a condenser which liquefies the heat medium in a vaporized state; a vapour pipe which guides the heat medium in the vaporized state from the evaporator to the condenser; and a liquid pipe which guides the heat medium in a liquefied state from the condenser to the evaporator. A first opening of the vapour pipe and a second opening of the liquid pipe are disposed in different positions from each other in a first direction, and are disposed so as to open into a heat medium accommodation space inside the evaporator at different positions from each other in a second direction, and which is different to the first direction, and also at different positions from each other in a third direction which intersects the first surface.

4 Claims, 7 Drawing Sheets (51) Int. Cl.
*H01L 23/427* (2006.01)
*F28D 21/00* (2006.01)
*F28F 1/40* (2006.01)
*F28F 9/02* (2006.01)

(52) U.S. Cl.
CPC ..... *H05K 7/20309* (2013.01); *H05K 7/20318* (2013.01); *H05K 7/20336* (2013.01); *F28D 2021/0028* (2013.01); *F28F 2009/0292* (2013.01)

(58) Field of Classification Search
CPC ........ F28D 15/046; F28D 15/04; F28D 15/02; G06F 1/20; G06F 2200/201; H05K 7/20336; H05K 7/20309; H05K 7/2039; H05K 7/20318; H05K 7/20809; H05K 7/20936

See application file for complete search history.

(56) References Cited

U.S. PATENT DOCUMENTS

| | | | | |
|---|---|---|---|---|
| 2007/0267182 | A1* | 11/2007 | Rusch | F28F 3/048 165/104.33 |
| 2009/0308576 | A1* | 12/2009 | Wang | F28D 15/0283 165/104.26 |
| 2010/0124012 | A1* | 5/2010 | Kondo | H05K 7/20818 361/679.47 |
| 2011/0192574 | A1* | 8/2011 | Yoshikawa | F28F 9/026 165/104.21 |
| 2013/0025826 | A1* | 1/2013 | Sakamoto | H01L 23/427 165/104.21 |
| 2013/0063896 | A1* | 3/2013 | Satou | H01L 23/427 361/700 |
| 2014/0165638 | A1* | 6/2014 | Yoshikawa | H01L 23/427 62/259.2 |
| 2014/0190738 | A1* | 7/2014 | Sakamoto | H05K 1/021 174/548 |
| 2014/0321056 | A1* | 10/2014 | Yoshikawa | H05K 7/20154 361/697 |
| 2016/0338226 | A1* | 11/2016 | Sakamoto | H01L 23/427 |

FOREIGN PATENT DOCUMENTS

| | | |
|---|---|---|
| JP | 2009-088127 A | 4/2009 |
| JP | 2009-276054 A | 11/2009 |
| JP | 2012-255624 A | 12/2012 |
| WO | 2015/146110 A1 | 10/2015 |

OTHER PUBLICATIONS

Written Opinion of PCT/JP2017/011159 dated May 16, 2017 [PCT/ISA/237].

\* cited by examiner

COOLING DEVICE

CROSS REFERENCE TO RELATED APPLICATIONS

This application is a National Stage of International Application No. PCT/JP2017/011159, filed Mar. 21, 2017, claiming priority based on Japanese Patent Application No. 2016-072859, filed Mar. 31, 2016, the contents of all of which are incorporated herein by reference in their entirety.

TECHNICAL FIELD

The present invention relates to a cooling device.

BACKGROUND ART

As a cooling device that cools a heat-generating body such as a semiconductor element, a cooling device of a phase-change cooling system (also called thermosiphon type), which can circulate refrigerant liquid without using a pump, is known.

The cooling device of the phase-change cooling system has higher cooling efficiency than a cooling device of a water cooling system and the like. In addition, the cooling device of the phase-change cooling system is capable of feeding refrigerant liquid to an evaporator by own weight of the refrigerant liquid and basically does not require a pump. Accordingly, the cooling device can be very compactly configured and can be installed even in a small space.

PTL 1 proposes, as a cooling device for an electronic device, a cooling device of a natural-circulation system which allows refrigerant liquid to circulate without using a pump. In PTL 1, connecting positions and the like of piping are devised in order to reduce height.

PTL 2 proposes a technique in which an opening of a liquid pipe for feeding refrigerant liquid into an evaporator is provided in such a way that the opening faces and is close to a heat receiving surface in order to improve performance of absorbing heat from a heat-generating electronic component used in a computer or the like.

CITATION LIST

Patent Literature

PTL 1: Japanese Unexamined Patent Application Publication No. 2007-010211
PTL 2: Japanese Unexamined Patent Application Publication No. 2009-088125

SUMMARY OF INVENTION

Technical Problem

In some cases, an orientation of the evaporator of the cooling device described above may need to be changed due to an installation orientation of a heat-generating body, for example. However, in the case of the cooling device described in PTL 1 or PTL 2, refrigerant vapor evaporated due to heat conducted from the heat-receiving surface may flow back through the liquid pipe essentially unless the heat-receiving surface points downward. When refrigerant vapor flows back through the liquid pipe in this way, cooling performance of the cooling device significantly degrades. A cooling device of this type therefore generally has a problem that flexibility of installation of an evaporator is low.

The present invention has been made in light of the circumstances described above and an object of the present invention is to provide a cooling device that can improve flexibility of installation of an evaporator without degrading cooling performance.

Solution to Problem

According to a first aspect of the present invention, a cooling device includes: an evaporator including a first surface to which heat is conducted from a heat-generating body; a heat medium that is accommodated in the evaporator and is vaporized by heat absorbed from the heat-generating body; a condenser that liquefies the heat medium in a vaporized state; a vapor pipe that guides the heat medium in the vaporized state from the evaporator to the condenser; and a liquid pipe that guides the heat medium in a liquefied state from the condenser to the evaporator, wherein a first opening of the vapor pipe on the evaporator side and a second opening of the liquid pipe on the evaporator side are disposed in positions different from each other in a first direction along the first surface, and disposed in positions different from each other in a second direction that is along the first surface and that is different from the first direction, and further in positions different from each other in a third direction that intersects the first surface, in such a way as to open into a heat medium accommodation space inside the evaporator.

Advantageous Effects of Invention

According to the present invention, flexibility of installation of an evaporator can be improved without degrading cooling performance.

EXAMPLE EMBODIMENT

First Example Embodiment

A cooling device according to a first example embodiment of the present invention will be described next based on drawings.

Figure 1:
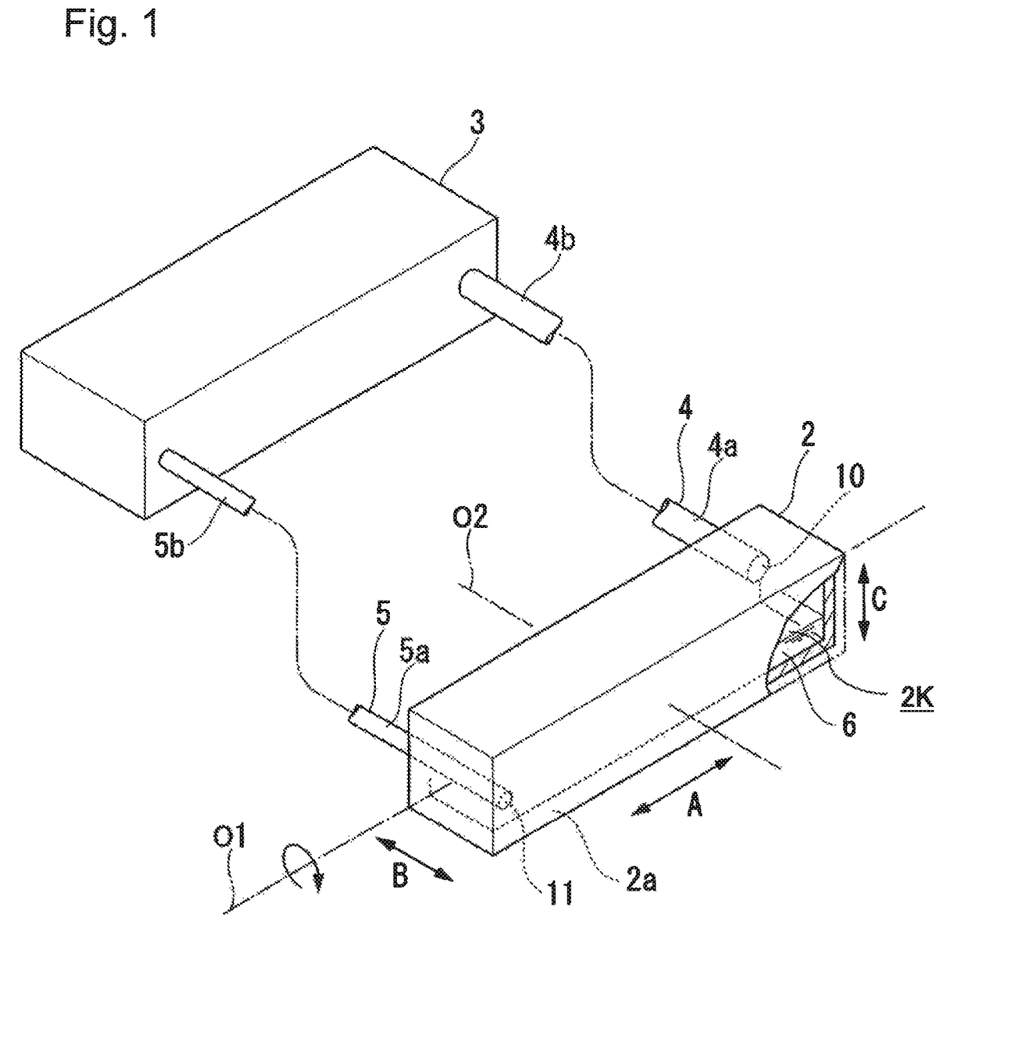
FIG. 1 is a perspective view illustrating an evaporator in a first attitude in a cooling device according to a first example embodiment of the present invention.

FIG. 1 is a perspective view illustrating an evaporator in a first attitude in the cooling device according to the first example embodiment of the present invention.

As illustrated in FIG. 1, the cooling device 1 according to the first example embodiment includes an evaporator 2, a condenser 3, a vapor pipe 4, a liquid pipe 5 and a heat medium 6. The cooling device 1 cools a heat-generating body which is not depicted.

The evaporator 2 includes a first surface 2a to which heat is conducted from a heat-generating body not depicted. The evaporator 2 includes both of a liquid phase and a vapor phase of the heat medium 6 in its interior space (a heat medium accommodation space) 2K. The first surface 2a conducts heat from the heat-generating body to at least the liquid phase of the heat medium 6. When the temperature of the first surface 2a exceeds a preset temperature due to heat absorbed from the heat-generating body, the heat medium 6 in the liquid phase is vaporized by evaporation. The heat-generating body is cooled by latent heat of the vaporization of the heat medium 6.

The condenser 3 liquefies a heat medium in a vaporized state. Specifically, the condenser 3 liquefies the heat medium in the vaporized state by cooling the heat medium. The condenser 3 is disposed higher than the evaporator 2 in a vertical direction.

The vapor pipe 4 is formed in such a way as to guide the heat medium 6 in a vaporized state from the evaporator 2 to the condenser 3 described above. A first end portion 4a of the vapor pipe 4 is connected to the evaporator 2 and a second end portion 4b of the vapor pipe 4 is connected to the condenser 3. An interior space of the vapor pipe 4 communicates with the interior space of the evaporator 2 and a flow path inside the condenser 3, respectively. The heat medium 6 evaporated inside the evaporator 2 is fed through the vapor pipe 4 from the evaporator 2 toward the condenser 3 disposed higher than the evaporator 2 by what is called thermal convection.

The liquid pipe 5 is formed in such a way as to guide the heat medium 6 in a liquefied state from the condenser 3 to the evaporator 2 described above. A first end portion 5a of the liquid pipe 5 is connected to the evaporator 2 and a second end portion 5b of the liquid pipe 5 is connected to the condenser 3. An interior space of the liquid pipe 5 communicates with the interior space of the evaporator 2 and the flow path inside the condenser 3, respectively. The heat medium 6 liquefied inside the condenser 3 is fed through the liquid pipe 5 from the condenser 3 toward the evaporator 2 disposed lower than the condenser 3 by its own weight.

An opening (first opening) 10 of the vapor pipe 4 on the evaporator 2 side and an opening (second opening) 11 of the liquid pipe 5 on the evaporator 2 side are disposed in positions different from each other in a first direction A along the first surface 2a. Similarly, the opening 10 and the opening 11 are disposed in positions different from each other in a second direction B that is along the first surface 2a and that is different from the first direction A. Further, the opening 10 and the opening 11 are disposed in positions different from each other in a third direction C that intersects the first surface 2a.

Thus, according to the cooling device 1 of the first example embodiment described above, the opening 10 of the vapor pipe 4 on the evaporator 2 side and the opening 11 of the liquid pipe 5 on the evaporator 2 side are disposed in positions different from each other in the first direction A along the first surface 2a and disposed in positions different from each other in the second direction B that is along the first surface 2a and that is different from the first direction A, and further in positions different from each other in the third direction C that intersects the first surface 2a in such a way as to open into the interior space 2K of the evaporator 2. This allows the attitude to be changed around each of two axis lines, i.e. a first axis line O1 and a second axis line O2, while keeping the opening 11 of the liquid pipe 5 disposed lower than the opening 10 of the vapor pipe 4. As a result, flexibility of installation of the evaporator 2 can be improved without degrading cooling performance by inhibiting vapor of the heat medium 6 from flowing back into the liquid pipe 5.

Second Example Embodiment

A second example embodiment of the present invention will be described next based on drawings. The second example embodiment is different in that the opening 11 of the liquid pipe 5 in the first example embodiment opens below a liquid level of a heat medium in the second example embodiment. Therefore, description will be provided by referring to FIG. 1 and giving the same reference signs to the same parts as those in the first example embodiment and repeated description thereof will be omitted.

Also in a cooling device according to the second example embodiment, an opening 10 of a vapor pipe 4 on an evaporator 2 side and an opening 11 of a liquid pipe 5 on the evaporator 2 side are disposed in positions different from each other in a first direction A along a first surface 2a. Further, the opening 10 and the opening 11 are disposed in positions different from each other in a second direction B that is along the first surface 2a and that is different from the first direction A, and further in positions different from each other in a third direction C that intersects the first surface 2a in such a way as to open into an interior space 2K of the evaporator 2.

Figure 2:
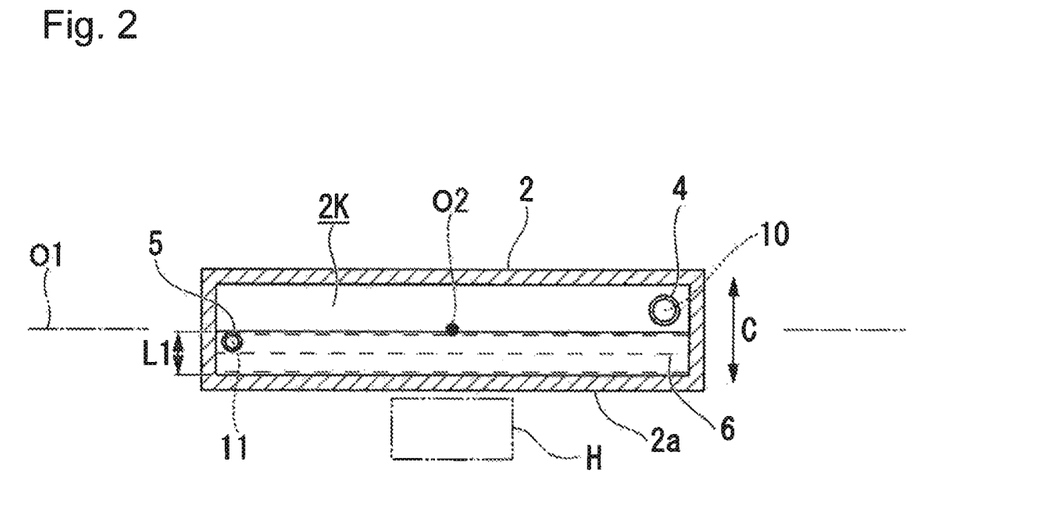
FIG. 2 is a cross-sectional view illustrating an evaporator in a first attitude in a cooling device according to a second example embodiment of the present invention.

FIG. 2 is a cross-sectional view illustrating an evaporator in a first attitude in the cooling device according to the second example embodiment of the present invention.

As illustrated in FIG. 2, a heat medium 6 has a liquid phase and a vapor phase in the interior space 2K of the evaporator 2. The heat medium 6 is set in such a way that a liquid level L1 of the liquid phase is at about one half of a height of the interior space 2K in the third direction C in the first attitude. In other words, an amount of the heat medium 6 in the liquid state that is about one half of the capacity of the interior space 2K is accommodated in the interior space 2K in the present example embodiment.

The first attitude of the evaporator 2 described above is an attitude in which the first surface 2a of the evaporator 2 points downward, in other words, an attitude when the evaporator 2 is installed in such a way that the first surface 2a extends in a horizontal direction. In the first attitude, a heat-generating body H is disposed below the first surface 2*a*. An insulator or the like that has a high heat conductivity may be provided between the heat-generating body H and the first surface 2*a* or the heat-generating body H may be in contact with the first surface 2*a*.

In the first attitude, the opening 10 of the vapor pipe 4 is disposed in the vapor phase in the interior space 2K. Further, in the first attitude, the opening 11 of the liquid pipe 5 is disposed in the liquid phase in the interior space 2K. Specifically, the opening 11 is disposed lower than the opening 10. In other words, in the first attitude, the disposition of the openings 10 and 11 and the liquid level L1 are set in such a way that the opening 10 opens into the vapor phase and the opening 11 is opens into the liquid phase.

Figure 3:
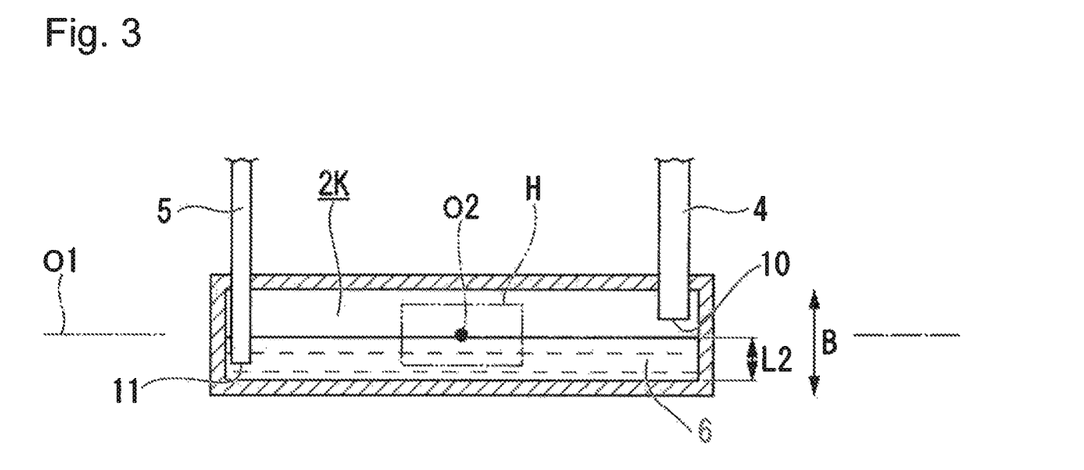
FIG. 3 is a cross-sectional view illustrating the evaporator in a second attitude in the cooling device according to the second example embodiment of the present invention.

FIG. 3 is a cross-sectional view illustrating the evaporator in a second attitude in the cooling device according to the second example embodiment of the present invention.

As illustrated in FIG. 3, even when the evaporator 2 is in the second attitude, a vapor phase and a liquid phase of the heat medium 6 are formed in the interior space 2K. The second attitude is an attitude in which the evaporator 2 is rotated about a first axis line O1 illustrated in FIG. 1, for example, by 90 degrees in such a way that the opening 11 is disposed lower than the opening 10. In the second attitude, the heat-generating body H is disposed lateral to the heat medium 6 and the first surface 2*a* is disposed to point sideward in such a way as to face the heat-generating body H. A liquid level L2 in the second attitude is also at about one half of the height of the interior space 2K in the second direction B.

Also in the second attitude, the opening 10 of the vapor pipe 4 is disposed in the vapor phase in the interior space 2K and the opening 11 of the liquid pipe 5 is disposed in the liquid phase in the interior space 2K, as in the first attitude.

Figure 4:
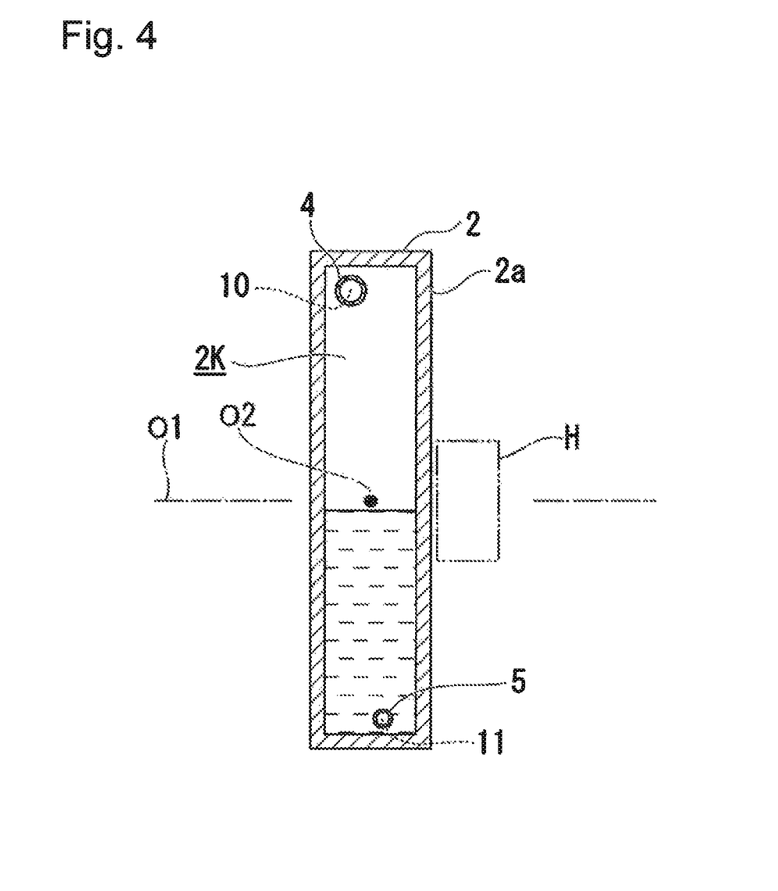
FIG. 4 is a cross-sectional view illustrating the evaporator in a third attitude in the cooling device according to the second example embodiment of the present invention.

FIG. 4 is a cross-sectional view illustrating the evaporator in a third attitude in the cooling device according to the second example embodiment of the present invention.

As illustrated in FIG. 4, even when the evaporator 2 is in the third attitude, a liquid phase and a vapor phase of the heat medium 6 are formed in the interior space 2K. The third attitude is an attitude in which the evaporator 2 is rotated about a second axis line O2 illustrated in FIG. 1, for example, by 90 degrees in such a way that the opening 11 is disposed lower than the opening 10. In the third attitude, the heat-generating body H is disposed lateral to the heat medium 6 and the first surface 2*a* is disposed to point sideward in such a way as to face the heat-generating body H.

In the third attitude, the opening 10 of the vapor pipe 4 is disposed in the vapor phase in the interior space 2K and the opening 11 of the liquid pipe 5 is disposed in the liquid phase in the interior space 2K, as in the first and second attitudes.

Figure 5A:
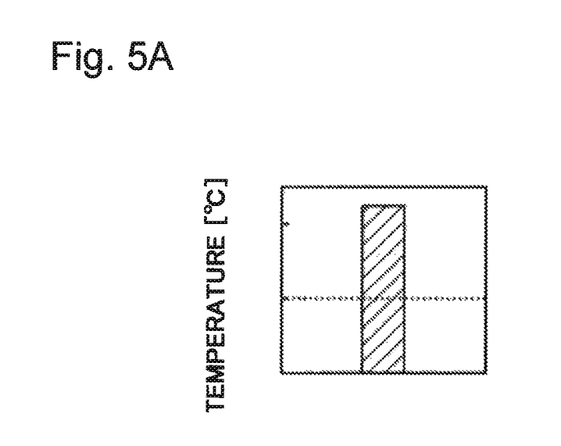
FIG. 5A is a diagram illustrating a graph showing temperature of a heat-generating body when the attitude of an evaporator in a cooling device according to a comparative example is changed around a first axis line and around a second axis line.
Figure 5B:
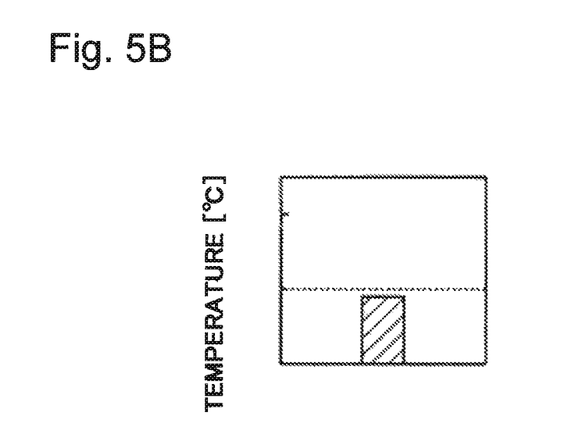
FIG. 5B is a diagram illustrating a graph showing temperature of a heat-generating body when the attitude of the evaporator in the cooling device according to the second example embodiment is changed around a first axis line and around a second axis line.

FIG. 5A is a diagram illustrating a graph showing temperature of a heat-generating body when the attitude of an evaporator in a cooling device according to a comparative example is changed around a first axis line and around a second axis line. FIG. 5B is a diagram illustrating a graph showing temperature of the heat-generating body H when the attitude of the evaporator 2 in the cooling device in the second example embodiment is changed around the first axis line O1 and around the second axis line O2.

In each of FIGS. 5A and 5B, the vertical axis represents a temperature of the heat-generating body H and a dashed line in the figure represents an allowable upper limit temperature of the heat-generating body H. The comparative example in FIG. 5A illustrates a case in which vapor of a heat medium 6 flows back from a liquid pipe when the attitude of the evaporator is changed to a second attitude and a third attitude around the first axis line O1 and around the second axis line O2. In this case, the cooling performance of the cooling device degrades and the temperature of the heat-generating body H exceeds the upper limit temperature.

On the other hand, in the case of the evaporator 2 of the second example embodiment described above, no degradation in cooling performance of the cooling device 1 is observed in any of the first attitude, the second attitude and third attitude as illustrated in FIG. 5B.

Therefore, according to the second example embodiment described above, vapor of the heat medium 6 can be inhibited from flowing back from the liquid pipe 5 in any of the first attitude, the second attitude and the third attitude.

As a result, the flexibility of installation of the evaporator 2 can be improved without degrading the cooling performance of the cooling device 1.

Third Example Embodiment

A third example embodiment of the present invention will be described next based on drawings.

Figure 6:
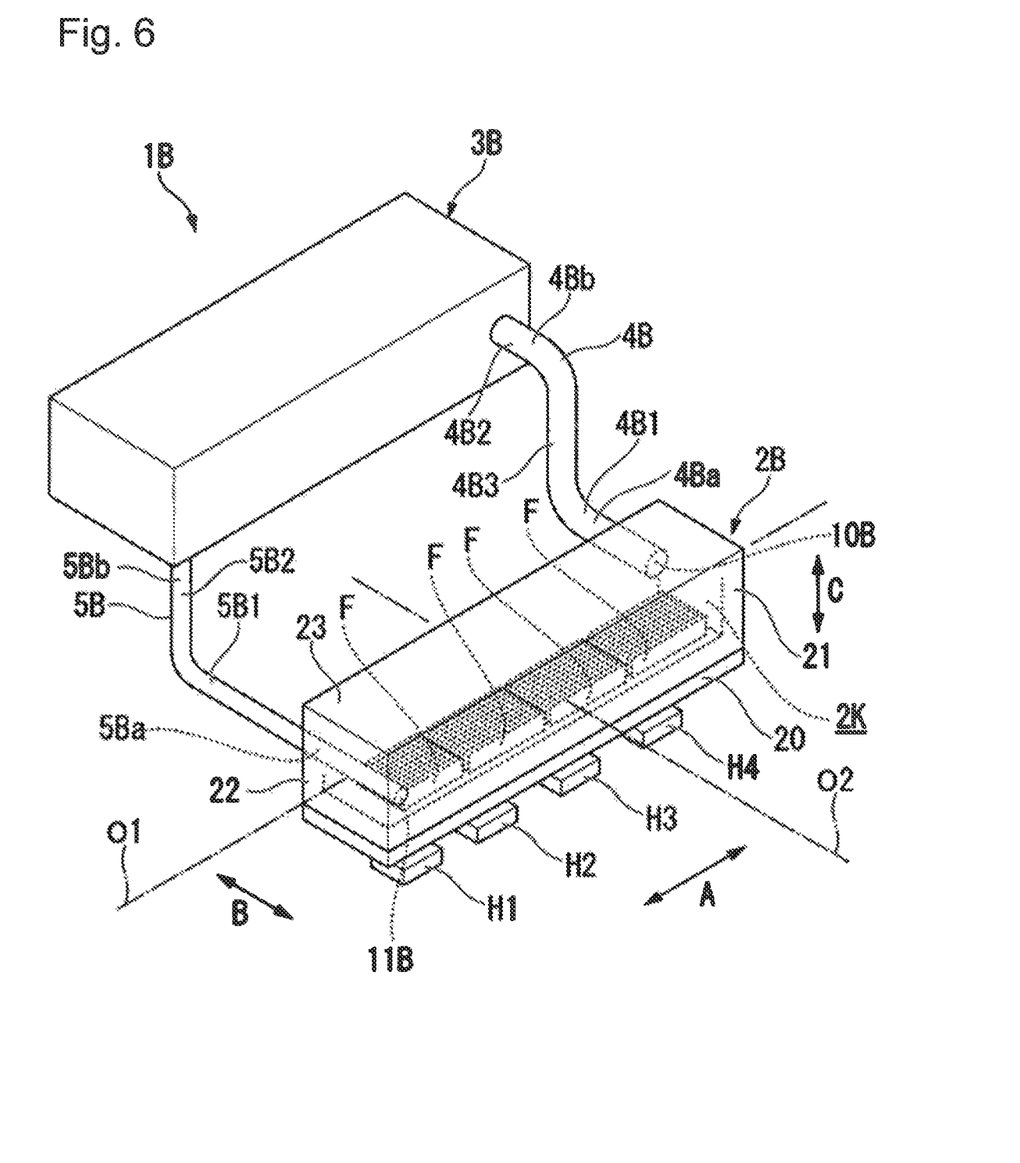
FIG. 6 is a perspective view illustrating an evaporator in a first attitude in a cooling device according to a third example embodiment of the present invention.
Figure 7:
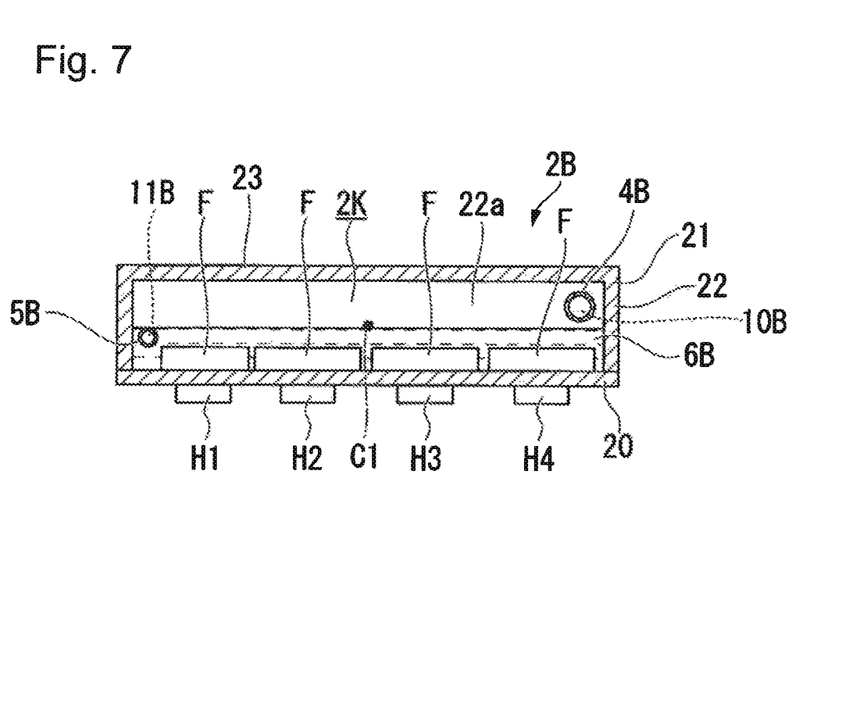
FIG. 7 is a cross-sectional view illustrating the evaporator in the first attitude in the cooling device according to the third example embodiment of the present invention.
Figure 8:
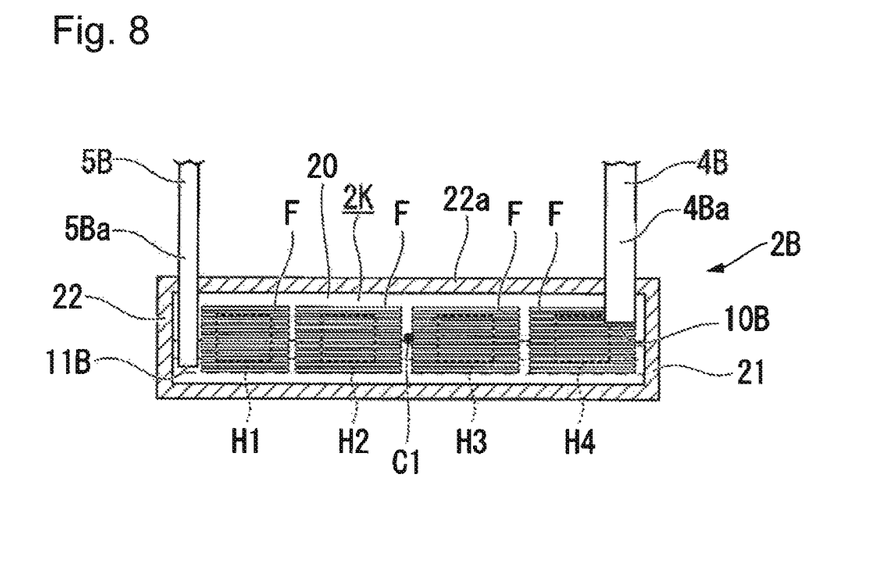
FIG. 8 is a cross-sectional view illustrating the evaporator in a second attitude in the cooling device according to the third example embodiment of the present invention.
Figure 9:
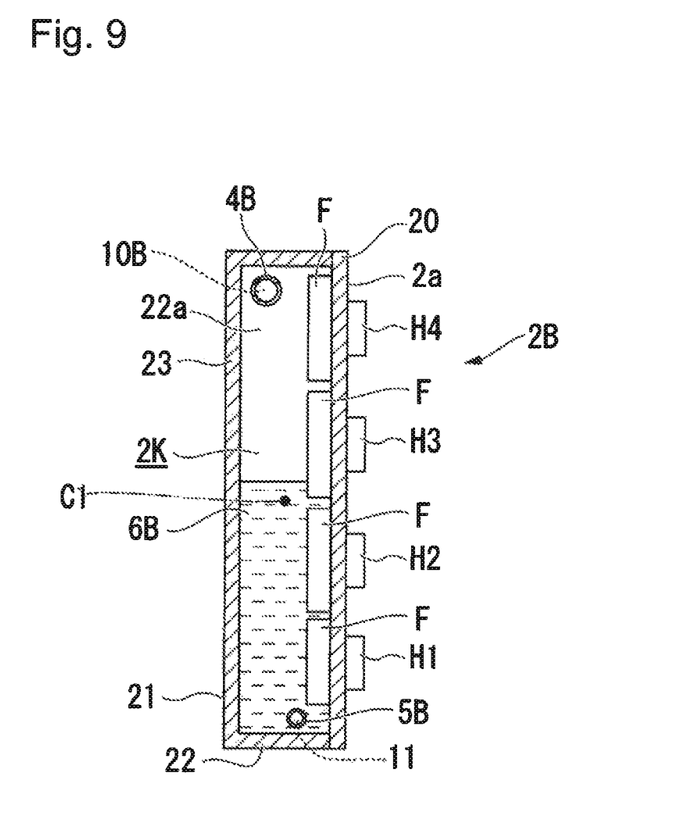
FIG. 9 is a cross-sectional view illustrating the evaporator in a third attitude in the cooling device according to the third example embodiment of the present invention.

FIG. 6 is a perspective view illustrating an evaporator in a first attitude in a cooling device according to the third example embodiment of the present invention. FIG. 7 is a cross-sectional view illustrating the evaporator in the first attitude in the cooling device according to the third example embodiment of the present invention. FIG. 8 is a cross-sectional view illustrating the evaporator in a second attitude in the cooling device according to the third example embodiment of the present invention. FIG. 9 is a cross-sectional view illustrating the evaporator in a third attitude in the cooling device according to the third example embodiment of the present invention.

As illustrated in FIGS. 6 to 9, the cooling device 1B in the third example embodiment includes an evaporator 2B, a condenser 3B, a vapor pipe 4B, a liquid pipe 5B, and a heat medium 6B (see FIG. 7). The cooling device 1B cools a plurality of heat-generating bodies H1 to H4. While an example in which four heat-generating bodies are provided will be described in the third example embodiment, the number of heat-generating bodies is not limited to four.

The evaporator 2B includes a main plate part 20 and a cover part 21.

The main plate part 20 is formed on a plane including a first direction A and a second direction B and is formed in a rectangular flat plate shape having a greater dimension in the first direction A than a dimension in the second direction B. A thickness direction of the main plate part 20 is a third direction C. The main plate part 20 forms an external surface of the evaporator 2B and includes a first surface 2*a* (see FIG. 9) to which heat is conducted from the heat-generating bodies H1 to H4. In the present example embodiment, the heat-generating bodies H1 to H4 are arranged in series. The main plate part 20 is disposed in such a way that a longitudinal direction of its rectangular shape coincides with a direction in which the heat-generating bodies H1 to H4 are arranged. A plurality of heat dissipating fins F are fixed on an inner surface of the main plate part 20 that is opposite to the first surface 2*a* in the thickness direction thereof. The four heat dissipating fins F are disposed in series in such a way that each of the heat dissipating fins F corresponds to a disposition of the heat-generating bodies H1 to H4.

The cover part 21 forms an interior space 2K between the cover part 21 and the main plate part 20. The cover part 21 includes side wall parts 22 and a main wall part 23.

The side wall parts 22 are formed in such a way as to rise from near respective four sides of the main plate part 20.

More specifically, the side wall parts 22 are formed in such a way as to rise in the third direction C.

The main wall part 23 is formed in a plate shape and is disposed in a position facing the main plate part 20. The interior space 2K of the evaporator 2B is formed by being enclosed with the inner surface of the main plate part 20, inner surfaces of the side wall parts 22 and an inner surface of the main wall part 23. While the main wall part 23 in the present example embodiment is illustrated as being in a flat plate shape, the main wall part 23 may be in a convex or concave curved plate shape.

The evaporator 2B includes both of a liquid phase and a vapor phase of the heat medium 6B in the interior space 2K. The first surface 2a conducts heat from the heat-generating bodies H1 to H4 to at least the liquid phase of the heat medium 6B. Specifically, at least the main plate part 20 of the evaporator 2B is made of a material having an excellent thermal conductivity such as an aluminum alloy, for example. When the temperature of the first surface 2a exceeds a preset temperature due to heat from the heat-generating bodies H1 to H4, liquid of the heat medium 6 which is in contact with the inner surface of the main plate part 20 and the heat dissipating fins F is vaporized by evaporation. Each of the heat-generating bodies H1 to H4 is cooled by latent heat of the vaporization of the heat medium 6.

The condenser 3B liquefies the heat medium 6B in a vaporized state, as in the first and second example embodiments.

Specifically, the condenser 3B liquefies the heat medium 6B in a vaporized state by cooling the vaporized heat medium 6B. The condenser 39 is disposed higher than the evaporator 2B in the vertical direction. The condenser 3B may be of any type that is capable of condensing the heat medium 6B and any of various types such as so-called air-cooled or water-cooled type can be used.

The vapor pipe 4B is formed in such a way as to guide the heat medium 6B in a vaporized state from the evaporator 2B to the condenser 39 described above. A first end portion 4Ba of the vapor pipe 4B is connected to the evaporator 2B and a second end portion 4Bb of the vapor pipe 4B is connected to the condenser 3B. More specifically, the first end portion 4Ba of the vapor pipe 4B is connected to a first side wall part 22a (see FIGS. 7 and 8) of the evaporator 2B that is closer to the condenser 3B. The vapor pipe 4B is formed in a crank shape by parts 4B1 and 4B2 that are disposed offset from each other and extend in a second direction B that is along the first surface 2a and is different from the first direction A and a part 4B3 that couples the parts 4B1 and 4B2 together.

An interior space of the vapor pipe 4B communicates with the interior space 2K of the evaporator 2B and a flow path inside the condenser 33. The heat medium 6B vaporized inside the evaporator 2B is fed through the vapor pipe 4B from the evaporator 2B toward the condenser 33 disposed higher than the evaporator 2B by what is called thermal convection.

The liquid pipe 5B is formed in such a way as to guide the heat medium 6B in a liquefied state from the condenser 3B to the evaporator 29 described above. A first end portion 5Ba of the liquid pipe 59 is connected to the evaporator 23 and a second end portion 5Bb of the liquid pipe 5B is connected to the condenser 33. More specifically, the first end portion 5Ba of the liquid pipe 5B is connected to the first side wall part 22a of the evaporator 23 that is closer to the condenser 3B. The liquid pipe 5B is formed in an L-shape by a part 531 that extends in the second direction B and a part 532 that extends in the third direction C.

Each of the vapor pipe 4B and the liquid pipe 5B in the third example embodiment is fixed to the evaporator 2B in such a way as to pass through the first side wall part 22a of the evaporator 29. In other words, the vapor pipe 4B and the liquid pipe 5B are connected to the evaporator 2B from the second direction B, i.e. the same direction from the condenser 3B toward the evaporator 2B. In further other words, the vapor pipe 4B and the liquid pipe 53 extend in the second direction B from the condenser 3B toward the evaporator 2B as viewed from above the cooling device 1B illustrated in FIG. 6 and are connected in such a way as to penetrate into the evaporator 2B. An opening 10B and an opening 11B are disposed apart from each other in the second direction B by making the liquid pipe 5B longer than the vapor pipe 4B in the evaporator 2B. This configuration can inhibit expansion (increase) of the volume (width) of the cooling device 1B. Note that a case in which the vapor pipe 4B and the liquid pipe 5B are connected from the same direction that is the second direction B has been described in the present example embodiment; however, the vapor pipe 43 and the liquid pipe 5B may be connected to the evaporator 2B from the same direction that is the first direction A or the third direction C.

An interior space of the liquid pipe 59 communicates with the interior space 2K in the evaporator 2 and a flow path inside the condenser 39. The heat medium 63 liquefied inside the condenser 3B is fed through the liquid pipe 5B by its own weight from the condenser 3B toward the evaporator 2B disposed lower than the condenser 3B.

The opening 10B of the vapor pipe 4B on the evaporator 2B side and the opening 11B of the liquid pipe 5B on the evaporator 2B side are disposed in positions different from each other in the first direction A along the first surface 2a. Similarly, the opening 10B and the opening 11B are disposed in positions different from each other in the second direction B that is along the first surface 2a and is different from the first direction A. Further, the opening 10B and the opening 11B are disposed in positions different from each other even in the third direction C that intersects the first surface 2a.

More specifically, the opening 10B and the opening 11B are disposed on opposite sides of the interior space 2K with a center point C1 of the interior space 2K of the evaporator 2B between them in each of the first direction A, the second direction B and the third direction C. While the openings 10B and 11B are disposed in the positions farthest from each other in FIGS. 7 to 9 in the present example embodiment, disposition of the openings 10B and 11B is not limited to this, provided that the disposition condition with respect to the center point C1 described above is satisfied.

The center point C1 described above is a point at which the middle position of the interior space 2K in the first direction A, the middle position of the interior space 2K in the second direction B, and the middle position of the interior space 2K in the third direction coincide with each other.

The liquid level of the heat medium 6B in the third example embodiment is set in such a way as to be located near the center point C1 in any of the first to third attitudes illustrated in FIGS. 7 to 9. Further, a circulation path formed by the evaporator 23, the condenser 33, the vapor pipe 4B and the liquid pipe 5B is evacuated to have a vacuum atmosphere lower than atmospheric pressure and its degree of vacuum is adjusted in accordance with a preset temperature of the heat-generating bodies H1 to H4. As the heat medium 63, hydrofluorocarbon (HFC), hydrofluoro-olefin (HFO), hydrofluoroether (HFE), perfluorocarbon (PFC) or the like, for example, can be used. More specifically, HFC-134a, HFO-1234yf or the like can be used. Note that the first to third attitudes are similar to those in the second example embodiment and therefore detailed description thereof will be omitted.

Thus, in the cooling device 1B of the third example embodiment described above, the opening 10B of the vapor pipe 4B on the evaporator 2B side and the opening 11B of the liquid pipe 5B on the evaporator 2B side are thus disposed in positions different from each other in the first direction A along the first surface 2a and are disposed in positions different from each other in the second direction B that is along the first surface 2a and is different from the first direction A, and further in positions different from each other in the third direction C that intersects the first surface 2a in such a way as to open into the interior space 2K of the evaporator 2B.

Accordingly, the attitude can be changed around each of two axis lines, i.e. a first axis line O1 extending in the first direction A and a second axis line O2 extending in the second direction B while keeping the opening 119 of the liquid pipe 5B disposed lower than the opening 10B of the vapor pipe 4B. As a result, vapor of the heat medium 6B can be inhibited from flowing back into the liquid pipe 5B and flexibility of installation of the evaporator 2B can be improved without degrading cooling performance.

Further, in any of the first attitude, the second attitude and the third attitude, the opening 11B of the liquid pipe 5B is disposed in the liquid phase below the liquid level of the heat medium 6B and the opening 103 of the vapor pipe 43 is disposed in the vapor phase above the liquid level of the heat medium 63. Accordingly, vapor of the heat medium 63 can be inhibited from flowing back from the liquid pipe 5B. As a result, the flexibility of installation of the evaporator 2 can be improved without degrading the cooling performance of the cooling device 1.

Moreover, the opening 10B and the opening 11B are disposed with the center point C1 between them in all of the first attitude, the second attitude, and the third attitude. Accordingly, as long as the liquid level of the heat medium 6B is aligned with the position of the center point C1, vapor can be prevented from flowing back into the liquid pipe 5B, without disposing the opening 10B and the opening 11B in positions in the interior space 2K that are farthest from each other.

Further, the evaporator 2B includes a plurality of heat dissipating fins F arranged in the first direction A. Accordingly, the area of contact between the heat medium 63 and the inner surface of the main plate part 20 to which heat is conducted from the plurality of heat-generating bodies H1 to H4 can be increased. As a result, the cooling performance of the cooling device 13 can be improved.

Moreover, the plurality of heat-generating bodies H1 to H4 can be cooled simultaneously in any of the first attitude and the second attitude.

Further, the evaporator 2B includes the main plate part 20 and the cover part 21. Accordingly, when assembling the evaporator 2B, the cover part 21 may be simply fixed in such a way that the cover part 21 is closed up by the main plate part 20 equipped with the heat dissipating fins F alter fixing the vapor pipe 4B and the liquid pipe 5B to the cover part 21 by welding or the like. Thus, the opening 10B and the opening 11B can be easily positioned and the evaporator 2B can be easily assembled.

The present invention is not limited to the example embodiments described above but includes variations produced by making various changes to the example embodiments described above without departing from the spirit of the present invention, in other words, the specific shapes, configurations and the like given in the example embodiments are illustrative only and can be changed as appropriate.

In the description of each example embodiment described above, a case in which the evaporator 2, 2B is a rectangular solid has been illustrated by an example. However, the evaporator 2, 2B is not limited to a rectangular solid. The evaporator 2, 2B may be in any shape that has an interior space 2K and can cool a heat-generating body. For example, the cover part 21 in the evaporator 2, 2B may have a shape having a curved surface. Specifically, the evaporator 2, 2B may have a semi-cylindrical shape, i.e. a shape having a semicircular cross-section along the second axis line O2 of the evaporator 2, 2B.

Further, the same effect can be achieved in a case as well where a cross-section of the cover part 21 is semi-cylindrical in shape as described above, provided that the configuration is employed in which the opening 10, 10B of the vapor pipe 4, 4B is disposed in the vapor phase in the interior space 2K and the opening 11, 11B of the liquid pipe 5, 5B is disposed in the liquid phase in the interior space 2K in the first, second and third attitudes.

Further, in each example embodiment described above, an example has been described in which the vapor pipe 4, 4B and the liquid pipe 5, 5B penetrate into the evaporator 2, 2B from the side near the condenser 3, 3B. However, the positions where the vapor pipe 4, 4B and the liquid pipe 5, 5B penetrate into the evaporator 2, 2B are not limited to the positions described above, provided that the disposition relationship between the opening 10 and the opening 11 and disposition relationship between the opening 10B and 11B are as described above.

Further, while a case has been described in which four heat-generating bodies H1 to H4 are cooled in the third example embodiment, the number of heat-generating bodies to be cooled is not limited to four but any plurality of heat-generating bodies may be cooled. Specifically, not more than three heat-generating bodies may be cooled or not less than five heat-generating bodies may be cooled. Further, while a case has been described in which a plurality of heat-generating bodies are arranged in series, the arrangement of heat-generating bodies is not limited to a series arrangement. For example, a plurality of heat-generating bodies may be arranged in parallel or arranged in a combination of series and parallel arrangements.

INDUSTRIAL APPLICABILITY

According to the present invention, the flexibility of installation of an evaporator can be improved without degrading cooling performance.

REFERENCE SIGNS LIST 1, 1B Cooling device
2 Evaporator
2a First surface
2B Evaporator
2K Interior space (heat medium accommodation space)
3, 3B Condenser
4 Vapor pipe
4a First end portion
4b Second end portion
4B Vapor pipe
4B1 to 4B3 Part 4Ba First end portion
4Bb Second end portion
5 Liquid pipe
5a First end portion
5b Second end portion
5B Liquid pipe
5B1, 5B2 Part
5Ba First end portion
5Bb Second end portion
6, 6B Heat medium
10, 10B Opening
11, 11B Opening
20 Main plate part
21 Cover part
22 Side wall part
22a First side wall part
23 Main wall part
A First direction
B Second direction
C Third direction
C1 Center point
F Heat Dissipating fin
H, H1 to H4 Heat-generating body
L1, L2 Liquid level
O1 First axis line
O2 Second axis line

The invention claimed is:

1. A cooling device comprising:
an evaporator including a first surface to which heat is conducted from a heat-generating body;
a heat medium that is accommodated in the evaporator and is vaporized by heat absorbed from the heat-generating body;
a condenser that liquefies the heat medium in a vaporized state;
a vapor pipe that guides the heat medium in the vaporized state from the evaporator to the condenser; and
a liquid pipe that guides the heat medium in a liquefied state from the condenser to the evaporator, wherein
a first opening of the vapor pipe on the evaporator side and a second opening of the liquid pipe on the evaporator side are disposed in positions different from each other in a first direction along the first surface, and disposed in positions different from each other in a second direction that is along the first surface and is different from the first direction and further in positions different from each other in a third direction that intersects the first surface in such a way as to open into a heat medium accommodation space inside the evaporator, wherein
the first surface is formed in a rectangular shape,
the first direction is along a longitudinal direction of the rectangular shape,
the second direction is orthogonal to the first direction,
the third direction is orthogonal to the first surface,
the vapor pipe and the liquid pipe are connected to the evaporator from the second direction,
the first opening and the second opening are disposed in such a way as to extend to inside the evaporator,
the second opening is, in predetermined attitudes, disposed in such a way as to open below a liquid level of the heat medium,
the predetermined attitudes include a first attitude, a second attitude and a third attitude,
the first attitude is an attitude that the third direction is orthogonal to horizontal directions and the second opening is disposed below the first opening,
the second attitude is an attitude that the second direction is orthogonal to the horizontal directions and the second opening is disposed below the first opening, and
the third attitude is an attitude that the first direction is orthogonal to the horizontal directions and the second opening is disposed below the first opening.

2. The cooling device according to claim 1, wherein the first opening is disposed in such a way as to open above the liquid level of the heat medium in the liquefied state in the evaporator.

3. The cooling device according to claim 1, wherein a plurality of the heat-generating bodies are provided in a row in the first direction.

4. The cooling device according to claim 1, wherein the evaporator includes a main plate part having the first surface and a cover part that forms the heat medium accommodation space between the main plate part and the cover part, and
the vapor pipe and the liquid pipe are connected to the cover part.

* * * * *